United States Patent
Fukui

(10) Patent No.: US 6,362,558 B1
(45) Date of Patent: Mar. 26, 2002

(54) PIEZOELECTRIC ELEMENT, PROCESS FOR PRODUCING THE SAME AND INK JET RECORDING HEAD

(75) Inventor: Toshimi Fukui, Ootsu (JP)

(73) Assignee: Kansai Research Institute, Osaka (JP)

( * ) Notice: Subject to any disclaimer, the term of this patent is extended or adjusted under 35 U.S.C. 154(b) by 0 days.

(21) Appl. No.: 09/741,833

(22) Filed: Dec. 22, 2000

(30) Foreign Application Priority Data

Dec. 24, 1999 (JP) ............................................. 11-366138

(51) Int. Cl.⁷ .............................................. H01L 41/08
(52) U.S. Cl. ..................................................... 310/358
(58) Field of Search ........................................ 310/358

(56) References Cited

U.S. PATENT DOCUMENTS

| | | | | |
|---|---|---|---|---|
| 4,355,256 A | * | 10/1982 | Perdujin et al. | ............ 310/358 |
| 4,383,196 A | * | 5/1983 | Perdujin et al. | ............ 310/358 |
| 5,059,566 A | * | 10/1991 | Kanai et al. | ................ 501/138 |
| 5,402,791 A | * | 4/1995 | Saitoh et al. | ............... 310/358 |
| 5,410,209 A | * | 4/1995 | Yamashita et al. | .......... 310/358 |
| 5,721,464 A | * | 2/1998 | Dibbern et al. | ............. 310/358 |
| 5,804,907 A | * | 9/1998 | Park et al. | .................... 310/358 |

FOREIGN PATENT DOCUMENTS

| | | | | |
|---|---|---|---|---|
| EP | 0877430 A2 | 11/1998 | ............ H01L/41/09 |
| JP | 52-22798 | * 2/1977 | ................. 310/358 |
| JP | 53-12138 | 4/1978 | .......... G06K/15/00 |
| JP | 1-199482 | * 8/1989 | ................. 310/358 |
| JP | 1-215076 | * 8/1989 | ................. 310/358 |
| JP | 2-265286 | * 10/1990 | ................. 310/358 |
| JP | 06040030 A | 2/1994 | ........... B41T/2/045 |
| JP | 09092897 A | 4/1997 | ........... H01L/41/09 |
| JP | 10139594 A | 5/1998 | ............ C30B/29/22 |
| JP | 10290035 A | 10/1998 | ......... H01L/41/187 |
| JP | 2000164947 A | 6/2000 | ......... H01L/41/083 |

* cited by examiner

*Primary Examiner*—Thomas M. Dougherty
(74) *Attorney, Agent, or Firm*—Rader Fishman & Grauer

(57) ABSTRACT

Provided are a piezoelectric element by which a pressure of a better displacement is obtained, a process for producing the same and an ink jet recording head having the piezoelectric element.

A piezoelectric element comprising a substrate (2), a lower electrode (3) formed on the substrate (2), piezoelectric film (7)[(4)(5)(6)] each containing Pb $(Zr_{1-x} Ti_x)O_3$ (0<x<1) and a valence compensation-type perovskite represented by formula $Pb(A_{1/3} B_{2/3})O_3$ (wherein A and B each represent a valence compensation-type perovskite) as basic components formed on the lower electrode (3), and an upper electrode (8) formed on the piezoelectric film (7). In the piezoelectric film, the concentration of A and/or B is changed in the thickness direction of the piezoelectric film, and the maximum value of the concentration of A and/or B is shown in a region within 60% from the upper electrode side in the thickness direction of the piezoelectric film. It is suited for an ink jet recording head.

15 Claims, 1 Drawing Sheet

PIEZOELECTRIC ELEMENT, PROCESS FOR PRODUCING THE SAME AND INK JET RECORDING HEAD

BACKGROUND OF THE INVENTION

1. Field of the Invention

The present invention relates to a piezoelectric element. More specifically, it relates to a piezoelectric element in which a component concentration in a thickness direction of a piezoelectric film is changed to obtain a pressure of a better displacement. Further, it relates to a process for producing the piezoelectric element. Still further, it relates to an ink jet recording head having the piezoelectric element.

2. Description of the Related Art

A piezoelectric film element having a piezoelectric film and an electrode is quite important as, for example, an actuator of an ink jet recording head, a micropump, a micromachine, a micromirror device or an ultrasonic vibrator. An ink jet recording head using a piezoelectric element has generally an ink chamber communicated with a nozzle and an ink supply unit, and it jets ink droplets from the nozzle by changing a volume of the ink chamber with a piezoelectric element. A piezoelectric element used in an ink jet recording head includes various types. For example, Japanese Examined Patent Publication No.53-12,138/1978 and Japanese Laid-Open Patent Publication No.6-40,030/1994 disclose a head using a piezoelectric element of a bending mode such as bimorph or unimorph. In the bending mode, a volume of an ink chamber is changed by bending a piezoelectric element constituting a part of a wall of an ink chamber like bimetal. In a part (substrate of a piezoelectric element) of a wall of an ink chamber, a lower electrode, a piezoelectric film and an upper electrode are laminated in this order. The piezoelectric film is polarized in a film thickness direction, and actuated in a d31 mode. For example, when an electric field of a direction in which the piezoelectric film is shrunk in a direction parallel to the surface is applied to both electrodes, the piezoelectric element is bent from the piezoelectric film toward the substrate in a perpendicular direction to the substrate. When an electric field of an opposite direction is applied, the piezoelectric film is extended, and the piezoelectric element is bend from the substrate toward the piezoelectric film.

In the piezoelectric element employed in this usage, satisfactory mechanical characteristics (pressure of a displacement) have to be obtained.

Japanese Laid-Open Patent Publication No. 10-290,035/1998 describes that a piezoelectric strain constant is stabilized by applying concentration gradients of zirconium and titanium in a film thickness direction and controlling heat generation of a piezoelectric film.

Japanese Laid-Open Patent Publication No.9-92,897/1997 describes a piezoelectric film in which a concentration of at least one of A and B of formula Pb(A×By)$O_3$ (x+y=1) is changed in a film thickness direction of the piezoelectric film and a concentration of at least one of A and B shows a maximum value in an interface between the piezoelectric film and a lower electrode.

Japanese Laid-Open Patent Publication No. 10-139,594/1998 describes that in order not to decrease a piezoelectric strain constant, a piezoelectric film is composed of a large number of layers, a main layer being made of a three-component material comprising lead magnesium niobate, lead zirconate (PZ) and lead titanate (PT) and a partial layer being made of a two-component material comprising lead zirconate titanate (PZT).

SUMMARY OF THE INVENTION

The object of the present invention is to provide a piezoelectric element that provides a pressure of an excellent displacement as compared with an ordinary piezoelectric element. Further, the object of the present invention is to provide a process for producing the piezoelectric element. Still further, the object of the present invention is to provide an ink jet recording head having the piezoelectric element.

The present inventors have assiduously conducted investigations, and have consequently found that the aim of the present invention is attained by a piezoelectric film in which a maximum value of a concentration of A and/or B of a basic component Pb $(A_{1/3} B_{2/3})O_3$ of a piezoelectric film is present in a region within 60% from an upper electrode side in a thickness direction of the piezoelectric film. This finding has led to the completion of the present invention.

That is, the present invention relates to a piezoelectric element comprising a substrate, a lower electrode formed on the substrate, a piezoelectric film containing Pb $(Zr_{1-x} Ti_x)O_3$ (0<x<1) and a valence compensation-type perovskite represented by general formula Pb$(A_{1/3} B_{2/3})O_3$ (wherein A and B each represent a metal element capable of forming the valence compensation-type perovskite) as basic components formed on the lower electrode, and an upper electrode formed on the piezoelectric film, wherein in any arbitrary regions in the thickness direction of the piezoelectric film, Pb $(Zr_{1-x} Ti_x)O_3$ and the valence compensation-type perovskite represented by the general formula Pb$(A_{1/3} B_{2/3})O_3$ are contained, in any arbitrary regions in the thickness direction of the piezoelectric film, a concentration of the valence compensation-type perovskite represented by the general formula Pb$(A_{1/3} B_{2/3})O_3$ is within a range of 20 to 40 mole %, and in the piezoelectric film, a concentration of A and/or B is changed in the thickness direction of the piezoelectric film and the maximum value of the concentration of A and/or B is shown in a region within 60% from the upper electrode side in the thickness direction of the piezoelectric film.

Preferable is a piezoelectric element in which in the piezoelectric film, the concentration of A and/or B is changed in the thickness direction of the piezoelectric film and the maximum value of the concentration of A and/or B is shown in a region within 40% from the upper electrode side in the thickness direction of the piezoelectric film.

By changing the concentration of A and/or B in the film thickness direction and providing the maximum value, the greater displacement of the piezoelectric film is obtained.

To obtain higher effects, Pb $(Zr_{1-x} Ti_x)O_3$ and the valence compensation-type perovskite represented by the general formula Pb$(A_{1/3} B_{2/3})O_3$ are contained in any arbitrary regions in the thickness direction of the piezoelectric film, and a concentration of the valence compensation-type perovskite represented by the general formula Pb$(A_{2/3} B_{2/3})O_3$ is within a range of 20 to 40 mole % in any arbitrary regions in the thickness direction of the piezoelectric film.

It is preferable that in the piezoelectric film, the concentration of A and/or B is changed in the thickness direction of the piezoelectric film and the minimum value of the concentration of A and/or B is shown in a region within 20% from the lower electrode side in the thickness direction of the piezoelectric film.

In the present invention, the thickness of the piezoelectric film is preferably between 1 and 25 μm in view of the use as an actuator of an ink jet recording head. It is more preferably between 1 and 12 μm. The piezoelectric film is composed of, preferably, 2 to 10 layers different in composition, more preferably 3 to 8 layers different in composition.

In the present invention, it is preferable that A represents an element selected from the group consisting of alkaline earth metals, Mn, Fe, Co, Ni, Cu and Zn and B represents an element selected from the group consisting of V, Nb and Ta. Examples of the alkaline earth metals include Mg, Ca, Sr and Ba.

Further, it is preferable that A represents an element selected from the group consisting of Mg, Ni and Zn and B represents an element selected from the group consisting of Nb and Ta.

It is preferable that the piezoelectric film of the piezoelectric element of the present invention further contains $(Ba_{1-y} Sr_y)TiO_3$ ($0 \leq y \leq 1$) as a third component.

The piezoelectric film of the piezoelectric element of the present invention is preferably formed by a gaseous phase method in the point of view of durability of the elements. Examples of the gaseous phase method include a sputtering method, a vacuum deposition method, a CVD (Chemical Vapor Deposition) method and a laser ablation method. A RF magnetron sputtering method and a MOCVD (Metal Organic Chemical Vapor Deposition) method are more preferable. By forming the piezoelectric film by the gaseous method, the film having a more excellent mechanical strength is obtained and a durability of the piezoelectric element is improved.

The present invention also relates to a process for producing the piezoelectric element. A process for producing the piezoelectric element in the present invention comprises a step of forming a piezoelectric film on a lower electrode and a step of forming an upper electrode on the piezoelectric film, the step of forming the piezoelectric film being conducted using a composition containing piezoelectric materials capable of forming the two basic components and, as required, the third component and/or precursors thereof.

Moreover, the present invention relates to an ink jet recording head having the piezoelectric element or the piezoelectric element produced by the process. The ink jet recording head comprises at least a nozzle, an ink chamber, an ink supply unit and a piezoelectric element, the nozzle and the ink supply unit being communicated with the ink chamber. More specifically it relates to an ink jet recording head using a piezoelectric element of a bending mode in which a substrate of the piezoelectric element serves also as a part of a wall of the ink chamber.

The ink jet recording head includes, for example, a head of a multi-nozzle in which plural nozzles are arranged in straight line or in zigzag fashion.

The ink jet recording head of the present invention can provide a satisfactory amount of displacement by using the piezoelectric element and can jet ink by variously changing a volume of one droplet upon controlling the amount of displacement. That is, an ink jet recording head is obtained which can control a volume of one droplet to be jetted over a wide range as compared with an ordinary head.

According to the present invention, a piezoelectric element is provided which gives a pressure of an excellent displacement. This piezoelectric element is preferably used in an ink jet recording head in particular, and this head can control the volume of one droplet to be jetted over a wide range as compared with an ordinary head.

DETAILED DESCRIPTION OF THE INVENTION

Figure 1:
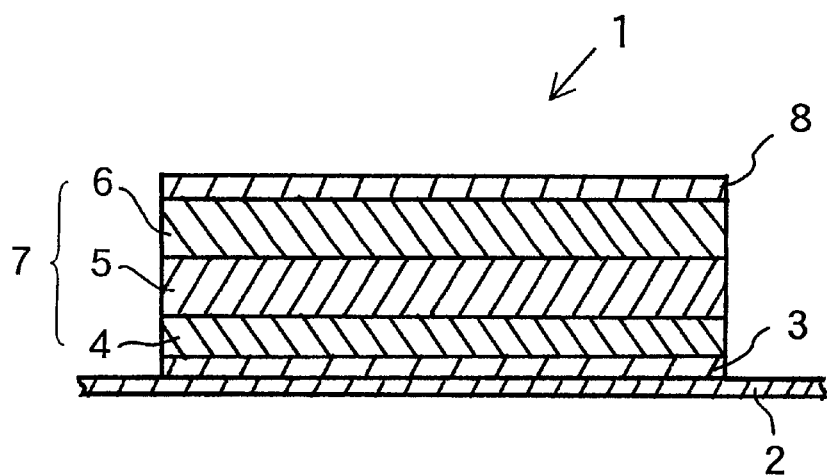
FIG. 1 is a sectional view showing an example of a simplified structure of a piezoelectric element of the present invention.

In the present invention, the piezoelectric film contains $Pb(Zr_{1-x} Ti_x)O_3$ ($0<x<1$) and a valence compensation-type perovskite represented by formula $Pb(A_{1/3} B_{2/3})O_3$ (wherein A and B each represent a metallic element capable of forming a valence compensation-type perovskite) as basic components.

It is preferable that A represents an element selected from the group consisting of alkaline earth metals such as Mg, Ca, Sr and Ba, Mn, Fe, Co, Ni, Cu and Zn, and B represents an element selected from V, Nb and Ta. Further, it is preferable that A represents an element selected from Mg, Ni and Zn and B represents an element selected from Nb and Ta because a greater amount of displacement is obtained in case of the use as a piezoelectric element.

It is preferable that the piezoelectric film of the piezoelectric element of the present invention further contains $(Ba_{1-y} Sr_y)TiO_3$ ($0 \leq y \leq 1$ hereinafter referred to as "BST") as a third component. For example, $BaTiO_3$ or $SrTiO_3$ is preferably used. By incorporating BST in the piezoelectric film, a leakage resistance and piezoelectric characteristics of the piezoelectric element can be improved.

In the present invention, the concentration of A and/or B is changed in the thickness direction of the piezoelectric film, and the maximum value of the concentration of A and/or B is present in a region within 60% from the upper electrode side in the thickness direction of the piezoelectric film. This construction provides a greater displacement of the piezoelectric film. It is preferable that the maximum value of the concentration of A and/or B is present in a region within 40% from the upper electrode side in the thickness direction of the piezoelectric film.

Further, it is preferable that the minimum value of the concentration of A and/or B is present in a region within 20% from the lower electrode side in the thickness direction of the piezoelectric film. When the maximum value is present in this region and the minimum value is present in this region, a still greater displacement of the piezoelectric film is obtained.

When the piezoelectric element is used as an actuator of an ink jet recording head, the thickness of the piezoelectric film is preferably between 1 and 25 μm, more preferably between 1 and 12 μm. When it is used as the actuator of the ink jet recording head, this film thickness is appropriate.

In the present invention, the concentration of A and/or B in the film thickness direction may be changed either continuously or discontinuously.

The piezoelectric film showing the continuous change of the concentration is formed upon continuously changing compositions of starting materials by a sputtering method, a vacuum deposition method, a CVD (Chemical Vapor Deposition) method or a laser ablation method. The piezoelectric film showing the discontinuous change of the concentration is prepared by forming plural layers different in composition by the foregoing method or a coating method. In either case, it is required that the maximum value of the concentration of A and/or B is present in a region within 60% from the upper electrode in the thickness direction of the piezoelectric film.

When the concentration of A and/or B is changed discontinuously, the piezoelectric film is composed of at least 2 layers different in composition. The piezoelectric film is composed of, preferably, 2 to 10 layers different in composition, more preferably, 3 to 8 layers different in composition. In view of the production, a structure made of 2 or 3 layers is preferable. A structure made of more than 10 layers is not problematic at all in view of the performance of the piezoelectric film. However, a structure made of 10 layers or less is preferable in view of the production cost. Further, with respect to plural layers different in composition, it is not required in particular that all of the layers are different in composition. For example, in case the piezoelectric film is made of 5 layers different in composition, the compositions of the 1st layer and the 3rd layer counted from the upper electrode side may be the same. Any structure will do so long as the maximum value of the concentration of A and/or B is present in the region within 60% from the upper electrode side in the thickness direction of the piezoelectric film.

The film thickness of each layer constituting the piezoelectric film is not particularly limited, and any film thickness will do so long as a satisfactory effect of displacement is obtained in the formation of the piezoelectric film. The film thickness of each layer can appropriately be determined, as required, in consideration of the change in composition of layers used, the layer structure and the film thickness of the overall piezoelectric film. For example, the film thickness of each layer is appropriately between 0.1 and 12.5 $\mu$m, preferably between 0.5 and 4 $\mu$m. Further, the film thicknesses of the respective layers are not necessarily the same.

Any material can be used in the substrate so long as it withstands calcination conditions of the piezoelectric film, and it is not particularly limited. Examples thereof include ceramics, glass and a metal. Specific examples thereof include zirconia, alumina, magnesia, silicon nitride, aluminum nitride, silicon carbide, silicon oxide and silicon. The thickness of the substrate is not particularly limited. It is preferably between 1 $\mu$m and 100 $\mu$m, more preferably between 1 $\mu$m and 50 $\mu$m.

The material of the lower electrode is not particularly limited, and any material which is ordinarily used in a piezoelectric element is available. Examples thereof include Pt and Au. A method for forming the lower electrode is not particularly limited. It is formed by, for example, a thick film method, a sputtering method or a deposition method. The thickness of the lower electrode is not particularly limited. It is preferably between 0.05 $\mu$m and 15 $\mu$m.

The surface of the substrate on which the lower electrode is formed may be subjected to an appropriate surface treatment in advance. For example, the surface may be formed of a silane coupling agent.

The electrode material is not particularly limited either. Any material which is ordinarily used in a piezoelectric element is available. Examples thereof include Pt and Au. A method for forming the upper electrode is not particularly limited. It is formed by, for example, a thick film method, a sputtering method or a deposition method. The thickness of the upper electrode is not particularly limited either. It is, for example, between 0.05 $\mu$m and 15 $\mu$m.

Further, a contact layer may be interposed between the lower electrode and the piezoelectric film or between the piezoelectric film and the upper electrode. As the contact layer, a layer containing titanium, chromium or titanium oxide is proposed.

A process for producing the piezoelectric element in the present invention is described below.

The process in the present invention comprises a step of forming a lower electrode on a substrate, a step of forming a piezoelectric film on the lower electrode and a step of forming an upper electrode on the piezoelectric film.

The piezoelectric film is formed by, for example, a sputtering method, a vacuum deposition method, a CVD method, a laser ablation method or a coating method using a composition containing piezoelectric materials capable of forming the two basic components and, as required, the third component and/or precursors thereof.

The piezoelectric film in which the concentration of A and/or B is continuously changed is produced by, for example, a sputtering method, a vacuum deposition method, a CVD method or a laser ablation method upon continuously changing compositions of starting materials as described above.

The formation of the plural layers different in composition which constitute the piezoelectric film can be conducted by the foregoing method or a coating method. The coating method is preferable because the production step is simple.

In the coating method, the composition containing the piezoelectric materials and/or precursors thereof may be a paste or a coating solution. The paste or the coating solution is coated to form each layer successively.

The paste of the composition is obtained by kneading a perovskite powder for forming each layer, a solvent and an organic polymer as a binder.

The perovskite powder is not particularly limited. However, for obtaining uniform film properties, a particle diameter measured by the BET method is preferably 0.5 $\mu$m or less, more preferably 0.2 $\mu$m or less.

The concentration of the oxide in the composition paste is preferably between 70 and 98% by weight, more preferably between 80 and 95% by weight.

The solvent is not particularly limited, and it is selected from various known solvents as required. Appropriate examples of the solvent include hydrophilic solvents, for example, alcohols such as methanol, ethanol, propanol and 2-ethoxyethanol, and ethers such as carbitol, butoxyethoxycarbitol and ethyl cellosolve.

An appropriate organic polymer is not particularly limited. Examples thereof include celluloses such as hydroxyethylcellulose and hydroxypropylcellulose (HPC), vinyl polymers such as polyvinyl alcohol (PVA), polyvinyl butyral (PVB), polyacrylic ester and polymethacrylic ester, polyethylene glycol (PEG), polyethylene oxide (PEO), an epoxy resin, a phenol resin, polyethylene terephthalate (PET) and a nylon resin. The amount of the organic polymer is not particularly limited. It can be selected from, for example, the range of 1 to 40% by weight, preferably the range of 5 to 20% by weight based on inorganic oxides.

The paste can also contain various known additives such as a dispersing agent, a plasticizer, a defoamer and a photo-curing agent as required.

The coating method is not particularly limited. It can include ordinary methods such as a spin coating method, a dipping method, a casting method, a screen printing method and a doctor blade method. After the coating, the solvent is removed by drying as required.

The coating solution of the composition is obtained by polymerizing a starting metal-containing compound (for example, a metal alkoxide) by a sol-gel method to form a precursor sol of a ferroelectric oxide. That is, the "precursor" of the ferroelectric oxide refers to a precursor which is obtained by the sol-gel method and converted into a substantially complete metal oxide.

The sol-gel method is a known method. For example, a precursor sol of lead zirconate titanate (PZT) can be obtained by hydrolyzing and polymerizing a titanium alkoxide, a zirconium alkoxide and a lead alkoxide or lead acetate. A desired metal-containing compound can be used as a starting material.

A solvent for hydrolysis/polymerization reaction is not particularly limited so long as it can dissolve a starting material such as an alkoxide or the like and water and is not coagulated at a temperature at which to add water. For example, as a polar solvent, alcohols such as methanol, ethanol and propanol can preferably be used. Further, a non-polar solvent such as toluene may be mixed at an appropriate ratio.

The hydrolysis/polymerization reaction can usually be conducted in the presence of an appropriate acid catalyst at −100 to 200° C., though it depends on a starting material such as an alkoxide or the like. In this manner, the coating solution of the composition containing the piezoelectric materials and/or precursors thereof can be obtained.

An appropriate organic polymer can be added to the coating solution of the piezoelectric composition. The organic polymer is not particularly limited. Examples thereof include celluloses such as hydroxyethylcellulose and hydroxypropylcellulose (HPC), vinyl polymers such as polyvinyl alcohol (PVA), polyvinyl butyral (PVB), polyacrylic ester and polymethacrylic ester, polyethylene glycol (PEG), polyethylene oxide (PEO), an epoxy resin, a phenol resin, polyethylene terephthalate (PET) and a nylon resin. Any polymer which can uniformly be incorporated in the coating solution is available.

Further, the amount of the organic polymer is not particularly limited. It can be selected from, for example, the range of 1 to 40% by weight, preferably the range of 5 to 20% by weight based on inorganic oxides. When the amount of the organic polymer exceeds 40% by weight, an appropriate film is hardly obtained even by heat treatment.

The coating solution can further contain various known additives such as a dispersing agent, a plasticizer, a defoamer and a photo-curing agent as required.

The coating method is not particularly limited. It can include ordinary coating methods such as a spin coating method, a dipping method, a casting method, a spray coating method, a die coating method, a screen printing method and a doctor blade method. After the coating, the solvent is removed by drying as required.

After the paste or the coating solution is coated, calcination is conducted. The calcination can be conducted at an appropriate temperature of, for example, 300 to 1,400° C., preferably 600 to 1,200° C., though it varies depending on the type of the paste or the coating solution and the amounts of the components. Further, it can be conducted in any atmosphere such as an inert gas atmosphere, a lead oxide atmosphere or an oxygen-containing atmosphere (for example, air) under normal pressure or reduced pressure. The calcination is preferably conducted in air at a temperature of room temperature to 300 though 1,400° C. for several seconds to 24 hours. Further, the temperature may gradually be raised. In this calcination, the organic component is removed almost completely, and a dense piezoelectric film is obtained.

The lower electrode can be formed on the substrate by a usual method. It is advisable that the formation is conducted by, for example, a thick film method such as screen printing, a sputtering method or a deposition method. The upper electrode can. also be formed on the piezoelectric film by a usual method. It is advisable that the formation is conducted by, for example, a thick film method, a sputtering method or a deposition method.

The elemental analysis of the piezoelectric film can be conducted by X-ray microanalysis (EPMA) in case of a film thickness of approximately 10 μm and by X-ray photoelectron spectroscopic analysis (ESCA), secondary ion mass spectroscopy (SIMS) or Auger electron analysis (AES) in case of a film thickness of approximately several micrometers.

The present invention also relates to an ink jet recording head having the piezoelectric element or the piezoelectric element obtained by the process as an actuator. The ink jet recording head includes a head of a multi-nozzle in which plural nozzles are arranged in straight line or in zigzag fashion too.

EXAMPLES

The present invention is illustrated more specifically by referring to the following Examples. However, the present invention is not limited thereto.

Examples 1 to 11 and Comparative Examples 1 to 3

(Formation of piezoelectric pastes)

Each (85 parts by weight) of perovskite powders having compositions shown below was kneaded with 6.5 parts by weight of ethyl cellosolve, 0.5 part by weight of polyethyl acrylate and 8 parts by weight of hydroxypropylcellulose to form a piezoelectric paste having an oxide concentration of 85% by weight.

The compositions of the following pastes are typical examples, and pastes having various other compositions are also available.

Paste 1
$0.20Pb(Mg_{1/3} Nb_{2/3})O_3 - 0.80Pb(Zr_{0.4} Ti_{0.6})O_3$
Paste 2
$0.35Pb(Mg_{1/3} Nb_{2/3})O_3 - 0.65Pb(Zr_{0.4} Ti_{0.6})O_3$
Paste 3
$0.30Pb(Mg_{1/3} Nb_{2/3})O_3 - 0.67Pb(Zr_{0.4} Ti_{0.6})O_3 - 0.03SrTiO_3$
Paste 4
$0.40Pb(Mg_{1/3} Nb_{2/3})O_3 - 0.55Pb(Zr_{0.4} Ti_{0.6})O_3 - 0.05SrTiO_3$
Paste 5
$0.20Pb(Zn_{1/3} Nb_{2/3})O_3 - 0.80Pb(Zr_{0.4} Ti_{0.6})O_3$
Paste 6
$0.30Pb(Zn_{1/3} Nb_{2/3})O_3 - 0.70Pb(Zr_{0.4} Ti_{0.6})O_3$
Paste 7
$0.40Pb(Zn_{1/3} Nb_{2/3})O_3 - 0.60Pb(Zr_{0.4} Ti_{0.6})O_3$
Paste 8
$0.20Pb(Mg_{1/3} Ta_{2/3})O_3 - 0.80Pb(Zr_{0.4} Ti_{0.6})O_3$
Paste 9
$0.25Pb(Mg_{1/3} Ta_{2/3})O_3 - 0.75Pb(Zr_{0.4} Ti_{0.6})O_3$
Paste 10
$0.30Pb(Mg_{1/3} Ta_{2/3})O_3 - 0.70Pb(Zr_{0.4} Ti_{0.6})O_3$
Paste 11
$0.35Pb(Mg_{1/3} Ta_{2/3})O_3 - 0.65Pb(Zr_{0.4} Ti_{0.6})O_3$
Paste 12
$0.40Pb(Mg_{1/3} Ta_{2/3})O_3 - 0.60Pb(Zr_{0.4} Ti_{0.6})O_3$
Paste 13
$0.25Pb(Mg_{1/3} Ta_{2/3})O_3 - 0.73Pb(Zr_{0.4} Ti_{0.6})O_3 - 0.02(Ba_{0.5} Sr_{0.5})TiO_3$
Paste 14
$0.30Pb(Mg_{1/3} Ta_{2/3})O_3 - 0.66Pb(Zr_{0.4} Ti_{0.6})O_3 - 0.04(Ba_{0.6} Sr_{0.4})TiO_3$
Paste 15
$0.35Pb(Mg_{1/3} Ta_{2/3})O_3 - 0.59Pb(Zr_{0.4} Ti_{0.6})O_3 - 0.06(Ba_{0.7} Sr_{0.3})TiO_3$
Paste 16
$0.20Pb(Ni_{1/3} Nb_{2/3})O_3 - 0.75Pb(Zr_{0.4} Ti_{0.6})O_3 - 0.05BaTiO_3$
Paste 17

$0.35Pb(Ni_{1/3} Nb_{2/3})O_3-0.60Pb(Zr_{0.4} Ti_{0.6})O_3-0.05BaTiO_3$
Paste 18
$0.20Pb(Mn_{1/3} V_{2/3})O_3-0.80Pb(Zr_{0.4} Ti_{0.6})O_3$
Paste 19
$0.30Pb(Mn_{1/3} V_{2/3})O_3-0.70Pb(Zr_{0.4} Ti_{0.6})O_3$
Paste 20
$0.35Pb(Mn_{1/3} V_{2/3})O_3-0.65Pb(Zr_{0.4} Ti_{0.6})O_3$
Paste 21
$0.20Pb(Co_{1/3} V_{2/3})O_3-0.80Pb(Zr_{0.4} Ti_{0.6})O_3$
Paste 22
$0.30Pb(Co_{1/3} V_{2/3})O_3-0.70Pb(Zr_{0.4} Ti_{0.6})O_3$
Paste 23
$0.35Pb(Co_{1/3} V_{2/3})O_3-0.65Pb(Zr_{0.4} Ti_{0.6})O_3$
Paste 24
$0.40Pb(Co_{1/3} V_{2/3})O_3-0.60Pb(Zr_{0.4} Ti_{0.6})O_3$
Paste 25
$0.20Pb(Cu_{1/3} V_{2/3})O_3-0.80Pb(Zr_{0.4} Ti_{0.6})O_3$
Paste 26
$0.25Pb(Cu_{1/3} V_{2/3})O_3-0.75Pb(Zr_{0.4} Ti_{0.6})O_3$
Paste 27
$0.30Pb(Cu_{1/3} V_{2/3})O_3-0.70Pb(Zr_{0.4} Ti_{0.6})O_3$
Paste 28
$0.35Pb(Cu_{1/3} V_{2/3})O_3-0.65Pb(Zr_{0.4} Ti_{0.6})O_3$
Paste 29
$0.40Pb(Cu_{1/3} V_{2/3})O_3-0.60Pb(Zr_{0.4} Ti_{0.6})O_3$
Paste 30
$Pb(Zr_{0.4} Ti_{0.6})O_3$
Paste 31
$0.06Pb(Zn_{1/3} Nb_{2/3})O_3-0.94Pb(Zr_{0.4} Ti_{0.6})O_3$
Paste 32
$0.12Pb(Zn_{1/3} Nb_{2/3})O_3-0.88Pb(Zr_{0.4} Ti_{0.6})O_3$
Paste 33
$0.18Pb(Zn_{1/3} Nb_{2/3})O_3-0.82Pb(Zr_{0.4} Ti_{0.6})O_3$
Paste 34
$0.42Pb(Zn_{1/3} Nb_{2/3})O_3-0.58Pb(Zr_{0.4} Ti_{0.6})O_3$
Paste 35
$0.48Pb(Zn_{1/3} Nb_{2/3})O_3-0.52Pb(Zr_{0.4} Ti_{0.6})O_3$
Paste 36
$0.54Pb(Zn_{1/3} Nb_{2/3})O_3-0.46Pb(Zr_{0.4} Ti_{0.6})O_3$ (Preparation of piezoelectric elements)

In Examples 1 to 11, piezoelectric elements for an ink jet recording head each having a piezoelectric film composed of plural layers different in composition were prepared using plural pastes among the pastes different in composition as listed above. Table 1 shows the number of layers different in composition which constitute the piezoelectric film, the type of the paste used in each layer and the thickness of each layer after calcination. The respective layers constituting the piezoelectric film were numbered in order from the lower electrode side.

FIG. 1 shows a piezoelectric element (1) having a three-layer structure which is an example of a piezoelectric element for an ink jet recording head having a piezoelectric film composed of plural layers different in composition. That is, a Pt paste was screen-printed on a zirconia substrate (2) having a thickness of 10 μm as a diaphragm such that the thickness after calcination became 5 μm to form a lower electrode (3).

Pastes for forming layers shown in Table 1 were laminated on the lower electrode (3) in order from a 1st layer (4) to an uppermost layer [3rd layer (6) in an example of FIG. 1] through screen printing to form a multilayer film (7). At this time, the film thickness of each layer was adjusted such that the thickness after calcination reached a value shown in Table 1, and a size of a piezoelectric material was adjusted to 200 μm×3 mm. After the resulting multilayer film (7) was calcined at 1,200° C. for 2 hours, an Au film was formed on the piezoelectric film by a sputtering method as an upper electrode (8) to obtain a piezoelectric element (1).

The selection of the paste and the selection of the thickness of each layer in Examples can be changed as required, and those in Examples are only illustrative.

In Comparative Examples 1 and 2, piezoelectric elements each having a single-layer piezoelectric film were prepared as in Examples 1 to 11 except using conditions shown in Table 1.

In Comparative Examples 3, 7 and 8, a piezoelectric element having a piezoelectric film composed of plural layers different in composition was prepared as in Examples 1 to 11 except using conditions shown in Table 1.

(Analysis and evaluation of piezoelectric elements)

In each of the piezoelectric elements obtained in Examples 1 to 11 and Comparative Examples 3, 7 and 8, the change in concentration of the valence compensation-type perovskite metal element contained in each piezoelectric film in the thickness direction of the piezoelectric film was analyzed using EPMA. At this time, the position of the maximum concentration was shown by percentage from the upper electrode side, and the position of the minimum concentration by percentage from the lower electrode side. The results of analysis are shown in Table 1. Analysis was conducted on vanadium in Examples 1, 2, 3, 10 and 11 and Comparative Example 3, on niobium in Examples 4, 5 and 7 and Comparative Examples 7 and 8 and on magnesium in Examples 6, 8 and 9.

The piezoelectric elements obtained in Examples 1 to 11 and Comparative Examples 1 to 3 were evaluated as follows. A vibration width of the elements in application of a voltage was measured using a Tencor meter. Since the film compositions of the elements were different and applied voltages for obtaining the maximum vibration width were different, the vibration width was evaluated by a value with which to provide the maximum vibration without unifying the applied voltage. The results of evaluation are shown in Table 1. As shown in Table 1, the elements obtained in Examples 1 to 11 provided the great vibration width compared with those in Comparative Examples 1 to 3 and Comparative Examples 7 and 8.

These results are due to the reasons that, in Examples 1 to 11, $Pb(Zr_{1-x} Ti_x)O_3$ (0<x<1) and the valence compensation-type perovskite represented by the general formula $Pb(A_{1/3} B_{2/3})O_3$ are contained in each layer which composes the piezoelectric film, and the concentration of the valence compensation-type perovskite represented by the general formula $Pb(A_{1/3} B_{2/3})O_3$ is within a range of 20 to 40 mole % in each layer which composes the piezoelectric film.

Further, in Examples 1 to 11, the great vibration width was obtained especially in Examples 7 to 9. These results are due to the reason that $(Ba_{1-y} Sr_y)TiO_3$ (0≦y≦1) is contained in the piezoelectric film in Examples 7 to 9.

Each leak current of the elements of Examples 4 and 7 in application of 50 V was measured. The leak current of Example 7 showed two figures smaller than that of Example 4. These results are also due to the reason that $(Ba_{1-y} Sr_y)TiO_3$ (0≦y≦1) is contained in the piezoelectric film in Example 7.

TABLE 1

|  | Number of layers | Type of paste | | | | | Thickness of layer (μm) | | | | | Vibration width (μm) | Position of maximum concentration (%) | Position of minimum concentration (%) |
|---|---|---|---|---|---|---|---|---|---|---|---|---|---|---|
|  |  | 1st layer | 2nd layer | 3rd layer | 4th layer | 5th layer | 1st layer | 2nd layer | 3rd layer | 4th layer | 5th layer |  |  |  |
| Ex. 1 | 2 | 18 | 20 | — | — | — | 6 | 4 | — | — | — | 0.33 | 0–32 | 0–55 |
| Ex. 2 | 3 | 21 | 22 | 24 | — | — | 2 | 4 | 4 | — | — | 0.34 | 0–36 | 0–17 |
| Ex. 3 | 5 | 25 | 26 | 27 | 28 | 29 | 2 | 2 | 2 | 2 | 2 | 0.35 | 0–18 | 0–16 |
| Ex. 4 | 2 | 1 | 2 | — | — | — | 6 | 4 | — | — | — | 0.40 | 0–35 | 0–54 |
| Ex. 5 | 3 | 5 | 6 | 7 | — | — | 2 | 4 | 4 | — | — | 0.42 | 0–36 | 0–18 |
| Ex. 6 | 5 | 8 | 9 | 10 | 11 | 12 | 2 | 2 | 2 | 2 | 2 | 0.42 | 0–17 | 0–18 |
| Ex. 7 | 2 | 16 | 17 | — | — | — | 6 | 4 | — | — | — | 0.43 | 0–34 | 0–56 |
| Ex. 8 | 3 | 1 | 3 | 4 | — | — | 2 | 4 | 4 | — | — | 0.44 | 0–35 | 0–16 |
| Ex. 9 | 5 | 8 | 13 | 14 | 15 | 12 | 2 | 2 | 2 | 2 | 2 | 0.44 | 0–18 | 0–17 |
| Ex. 10 | 3 | 18 | 20 | 30 | — | — | 5 | 3 | 2 | — | — | 0.31 | 37 | 93–100 |
| Ex. 11 | 3 | 21 | 23 | 22 | — | — | 3 | 3 | 4 | — | — | 0.27 | 54 | 0–16 |
| CEx. 1 | 1 | 30 | — | — | — | — | 10 | — | — | — | — | 0.21 | — | — |
| CEx. 2 | 1 | 27 | — | — | — | — | 10 | — | — | — | — | 0.21 | — | — |
| CEx. 3 | 5 | 29 | 28 | 27 | 26 | 25 | 2 | 2 | 2 | 2 | 2 | 0.18 | 93–100 | 94–100 |
| CEx. 7 | 3 | 31 | 32 | 33 | — | — | 2 | 4 | 4 | — | — | 0.24 | 0–34 | 0–15 |
| CEx. 8 | 3 | 34 | 35 | 36 | — | — | 2 | 4 | 4 | — | — | 0.23 | 0–33 | 0–14 |

Ex. - Example
CEx. - Comparative Example

Figure 2:
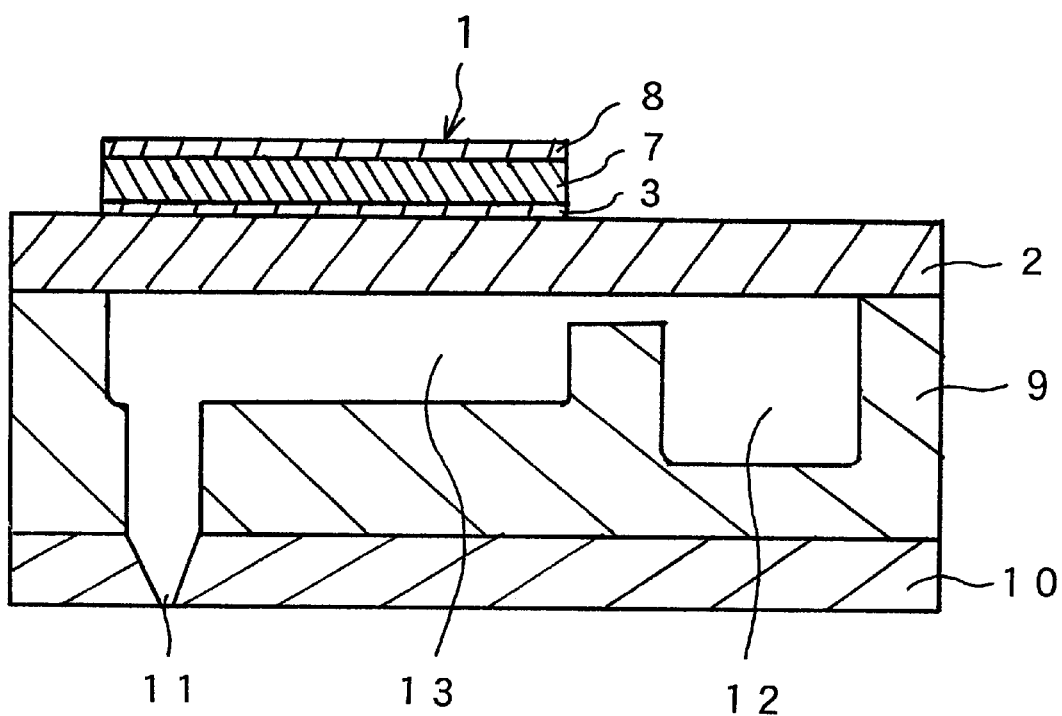
FIG. 2 is a sectional view showing an example of a simplified structure of an ink jet recording head using the piezoelectric element of the present invention.

An ink jet recording head was produced using each of the piezoelectric elements obtained in Examples 1 to 11. FIG. 2 is a sectional view showing a simplified structure thereof. A flow path plate (9) was formed with silicon, and a nozzle plate (10) with a stainless steel. A nozzle (11) communicated with an ink chamber (13) was formed in the nozzle plate (10). Ink was supplied from an ink tank (not shown in FIG. 2) to the ink chamber (13) via an ink supply path (12), and jetted from the nozzle (11).

Ink was jetted using each of the ink jet recording heads by applying a driving signal repeated at a frequency of 10 kHz to the piezoelectric element. Then, a satisfactory jet power was obtained. Further, when a waveform of the driving signal was changed in the ink jet recording head obtained from the piezoelectric element in Example 6 as required, the volume of an ink droplet could be controlled in the range of 2 pl to 31 pl.

Examples 13 to 23 and Comparative Examples 4 to 6

(Formation of piezoelectric coating solutions)

Dehydrated lead acetate, metallic magnesium, dehydrated zinc acetate, dehydrated nickel acetate, pentaethoxyniobium, pentaethoxytantalum, tetra-i-propoxytitanium, tetra-n-butoxyzirconium, metallic barium or diethoxybarium, metallic strontium or diethoxystrontium, dehydrated manganese acetate, triethoxyoxovanadium, dehydrated cobalt acetate and dehydrated copper acetate were used as starting materials.

For forming each of coating solutions 1 to 30 having compositions corresponding to the pastes 1 to 30, each of the corresponding starting materials was added to 2-methoxyethanol such that the molar ratio of the metal component in each coating solution was the same as that in each of the pastes 1 to 30. The mixture was heat-treated at 120° C. for 6 hours to obtain a brown uniform solution. To the resulting solution was added dropwise 0.1 M hydrochloric acid diluted with 2-ethoxyethanol. The amount of water was the same molar amount as that of an alkoxide used. A 2-methoxyethanol solution of hydroxypropylcellulose (HPC-L) was added as a thickener. The amount of hydroxypropylcellulose based on the inorganic composition was 10% by weight as a solid content. The oxide concentration of the resulting coating solution was adjusted to 20% by weight. In this manner, the coating solutions 1 to 30 having the same compositions as the pastes 1 to 30 were obtained.

(Preparation of piezoelectric elements)

In Examples 13 to 23, piezoelectric elements for an ink jet recording head each having a piezoelectric film composed of plural layers different in composition were prepared using plural coating solutions among the foregoing coating solutions. Table 2 shows the number of layers different in composition which constitute the piezoelectric film, the type of the coating solution used in each layer, the thickness of each layer after calcination, the results of evaluation and the results of analysis. The layers constituting the piezoelectric film were numbered in order from the lower electrode side.

FIG. 1 shows a piezoelectric element (1) having a three-layer structure which is an example of a piezoelectric element for an ink jet recording head having a piezoelectric film composed of plural layers different in composition. That is, a Ti film having a thickness of 50 nm and a Pt film having a thickness of 1 μm were formed in this order as a lower electrode (3) on an alumina substrate (2) having a thickness of 5 μm as a diaphragm by a sputtering method.

Coating solutions for forming layers shown in Table 2 were laminated on the lower electrode (3) in order from a 1st layer (4) to an uppermost layer [3rd layer (6) in an example of FIG. 1] by a spin coating method to form a multilayer film (7). The film of each layer was formed as follows. First, the film was formed by a spin coating method (1,200 rpm, 30 seconds) using the coating solution for forming the 1st layer (4), then dried at 120° C., and calcined at 400° C. (rate of temperature rise: 5° C./min, retained at 400° C. for 30 minutes). After the uppermost layer was likewise laminated, the multilayer film was calcined at 900° C. (rate of temperature rise: 10° C./min, retained at 900° C. for 15 minutes). At this time, the film thickness of each layer was adjusted such that the thickness after calcination reached a value shown in Table 2.

A photoresist was coated on the resulting piezoelectric film, and patterning was then conducted by exposure. A pattern of a piezoelectric material was formed by chemical etching treatment such that a size of the piezoelectric material reached 200 μm×3 mm. An Au film was formed on the resulting pattern of the piezoelectric material by a sputtering method to obtain a desired piezoelectric element (1).

In Comparative Examples 4 and 5, piezoelectric elements each having a single-layer piezoelectric film were prepared as in Examples 13 to 23 except using conditions shown in Table 2.

In Comparative Example 6, a piezoelectric element having a piezoelectric film composed of plural layers different in composition was prepared as in Examples 13 to 23 except using conditions shown in Table 2.

(Evaluation of piezoelectric elements)

In each of the piezoelectric elements obtained in Examples 13 to 23 and Comparative Example 6, the change in concentration of the valence compensation-type perovskite metal element contained in each piezoelectric film in the thickness direction of the piezoelectric film was analyzed using EPMA. At this time, the position of the maximum concentration was shown by percentage from the upper electrode side, and the position of the minimum concentration by percentage from the lower electrode side. The results of analysis are shown in Table 2. Analysis was conducted on vanadium in Examples 13, 14, 15, 22 and 23 and Comparative Example 6, on niobium in Examples 16, 17 and 19 and on magnesium in Examples 18, 20 and 21.

With respect to the piezoelectric elements obtained in Examples 13 to 23 and Comparative Examples 4 to 6, a vibration width was evaluated as in Example 1. The results of evaluation are shown in Table 2. As shown in Table 2, the elements obtained in Examples 13 to 23 provided the great vibration width compared with those in Comparative Examples 4 to 6.

These results are due to the reasons that, in Examples 13 to 23, Pb $(Zr_{1-x} Ti_x)O_3$ (0<x<1) and the valence compensation-type perovskite represented by the general formula $Pb(A_{1/3} B_{2/3})O_3$ are contained in each layer which composes the piezoelectric film, and the concentration of the valence compensation-type perovskite represented by the general formula $Pb(A_{1/3} B_{2/3})O_3$ is within a range of 20 to 40 mole % in each layer which composes the piezoelectric film.

Further, in Examples 13 to 23, the great vibration width was obtained especially in Examples 19 to 21. These results are due to the reason that $(Ba_{1-y} Sr_y)TiO_3$ (0≤y≤1) is contained in the piezoelectric film in Examples 19 to 21.

Each leak current of the elements of Examples 16 and 19 in application of 50 V was measured. The leak current of Example 19 showed two figures smaller than that of Example 16. These results are also due to the reason that $(Ba_{1-y} Sr_y)TiO_3$ (0≤y≤1) is contained in the piezoelectric film in Example 19.

An ink jet recording head was produced as in Example 1 using each of the piezoelectric elements obtained in Examples 13 to 23. Ink was jetted using each of the ink jet recording heads by applying a driving signal repeated at a frequency of 10 kHz to the piezoelectric element. Then, a satisfactory jet power was obtained. Further, when a waveform of the driving signal was changed in the ink jet recording head obtained from the piezoelectric element in Example 18 as required, the volume of an ink droplet could be controlled in the range of 3 pl to 29 pl.

Example 25

A piezoelectric element for an ink jet recording head having a piezoelectric film of a composition $z[Pb(Mg_{1/3} Ta_{2/3})O_3]$–$(1-z)[Pb(Zr_{0.4} Ti_{0.6})O_3]$ (0≤z≤1) in which z was continuously changed was prepared by the MOCVD (Metal Organic Chemical Vapor Deposition) method. On a silicon substrate having a thickness of 10 μm as a diaphragm, a Ti film was formed to a thickness of 50 nm and a Pt film to a thickness of 0.5 μm in this order by a sputtering method to provide a lower electrode.

A piezoelectric film of a composition $z[Pb(Mg_{1/3} Ta_{2/3})O_3]$–$(1-z)[Pb(Zr_{0.4} Ti_{0.6})O_3]$ (0≤z≤1) was formed by the MOCVD method at an oxygen partial pressure of 2.2 torr and a substrate temperature of 600° C. using lead bis (dipivaloylmethanate), tetra-t-butoxyzirconium, tetra-i-propoxytitanium, magnesium bis(dipivaloylmethanate) and pentaisopropoxytantalum as starting materials. In the film formation, flow rates of the starting materials were adjusted such that z was 0.2 in the initial composition. The flow rates of the starting materials were changed such that z was gradually increased. When z reached 0.4, z was reduced again. The film formation was conducted until the film thickness finally reached 8 μm. After the film formation, the piezoelectric film was sintered again at a temperature of 1,000° C. to provide a piezoelectric film.

A photoresist was coated on the resulting piezoelectric film, and patterning was then conducted by exposure. A pattern of a piezoelectric material was formed by chemical etching treatment such that a size of the piezoelectric material reached 200 μm×3 mm. An Au film was formed on the resulting pattern of the piezoelectric material by a sputtering method to obtain a piezoelectric element.

EPMA analysis was conducted from the upper electrode side of the piezoelectric film to find the positions of the

TABLE 2

| | | Type of coating solution | | | | | Thickness of layer (μm) | | | | | | Position of maximum | Position of minimum |
| | Number of layers | 1st layer | 2nd layer | 3rd layer | 4th layer | 5th layer | 1st layer | 2nd layer | 3rd layer | 4th layer | 5th layer | Vibration width (μm) | concentration (%) | concentration (%) |
|---|---|---|---|---|---|---|---|---|---|---|---|---|---|---|
| Ex. 13 | 2 | 18 | 20 | — | — | — | 6 | 4 | — | — | — | 0.33 | 0–29 | 0–52 |
| Ex. 14 | 3 | 21 | 22 | 24 | — | — | 2 | 4 | 4 | — | — | 0.35 | 0–30 | 0–15 |
| Ex. 15 | 5 | 25 | 26 | 27 | 28 | 29 | 2 | 2 | 2 | 2 | 2 | 0.35 | 0–14 | 0–14 |
| Ex. 16 | 2 | 1 | 2 | — | — | — | 6 | 4 | — | — | — | 0.41 | 0–30 | 0–53 |
| Ex. 17 | 3 | 5 | 6 | 7 | — | — | 2 | 4 | 4 | — | — | 0.42 | 0–32 | 0–15 |
| Ex. 18 | 5 | 8 | 9 | 10 | 11 | 12 | 2 | 2 | 2 | 2 | 2 | 0.42 | 0–16 | 0–16 |
| Ex. 19 | 2 | 16 | 17 | — | — | — | 6 | 4 | — | — | — | 0.43 | 0–31 | 0–55 |
| Ex. 20 | 3 | 1 | 3 | 4 | — | — | 2 | 4 | 4 | — | — | 0.45 | 0–30 | 0–16 |
| Ex. 21 | 5 | 8 | 13 | 14 | 15 | 12 | 2 | 2 | 2 | 2 | 2 | 0.45 | 0–16 | 0–16 |
| Ex. 22 | 3 | 18 | 20 | 30 | — | — | 5 | 3 | 2 | — | — | 0.32 | 40 | 93–100 |
| Ex. 23 | 3 | 21 | 23 | 22 | — | — | 3 | 3 | 4 | — | — | 0.27 | 57 | 0–20 |
| CEx. 4 | 1 | 30 | — | — | — | — | 10 | — | — | — | — | 0.22 | — | — |
| CEx. 5 | 1 | 27 | — | — | — | — | 10 | — | — | — | — | 0.21 | — | — |
| CEx. 6 | 5 | 29 | 28 | 27 | 26 | 25 | 2 | 2 | 2 | 2 | 2 | 0.17 | 94–100 | 94–100 |

Ex. - Example
CEx. —Comparative Example maximum concentration and the minimum concentration of magnesium in the thickness direction of the piezoelectric film. The position of the maximum concentration was 23% from the upper electrode side, and the position of the minimum concentration was 0 to 2% from the lower electrode side. A vibration width was evaluated as in Example 1, and it was found to be 0.41 μm.

An ink jet recording head was produced as in Example 1 using this piezoelectric element. Ink was jetted using this ink jet recording head by applying a driving signal repeated at a frequency of 10 kHz to the piezoelectric element. When a waveform of the driving signal was changed as required, the volume of an ink droplet could be controlled in the range of 2 pl to 33 pl.

Then, using the ink jet recording head having piezoelectric elements of Examples 1 to 11, 13 to 23 and 25, a durability test of $10^8$ time continuous jets was conducted to compare the jet speed of the ink droplet before or after the durability test in each head. The decrease of the jet speed in the head of Example 25 showed about 5%, which was the smallest of all the heads. The decrease of the jet speed in the heads of Examples 1 to 23 showed within a range of 9 to 27%. These results are due to the reason that the piezoelectric film of the head of Example 25 formed by the gaseous phase method has an especially excellent mechanical strength.

The present invention can be embodied in other various forms without departing from the spirit or essential characteristics thereof. The Examples are therefore only illustrative in all respects and shall not be interpreted in a limiting sense. Further, all changes that fall within meets and bounds of claims, or equivalence of such meets and bounds are within the scope of the present invention.

What is claimed is:

1. A piezoelectric element comprising a substrate, a lower electrode formed on the substrate, a piezoelectric film containing Pb $(Zr_{1-x} Ti_x)O_3$ $(0<x<1)$ and a valence compensation-type perovskite represented by general formula $Pb(A_{1/3} B_{2/3})O_3$ (wherein A and B each represent a metal element capable of forming a valence compensation-type perovskite) as basic components formed on the lower electrode, and an upper electrode formed on the piezoelectric film, wherein in any arbitrary regions in the thickness direction of the piezoelectric film, Pb $(Zr_{1-x} Ti_x)O_3$ and the valence compensation-type perovskite represented by the general formula $Pb(A_{1/3} B_{2/3})O_3$ are contained, in any arbitrary regions in the thickness direction of the piezoelectric film, a concentration of the valence compensation-type perovskite represented by the general formula $Pb(A_{1/3} B_{2/3})O_3$ is within a range of 20 to 40 mole %, and in the piezoelectric film, a concentration of A and/or B is changed in the thickness direction of the piezoelectric film and the maximum value of the concentration of A and/or B is shown in a region within 60% from the upper electrode side in the thickness direction of the piezoelectric film.

2. The piezoelectric element according to claim 1, wherein in the piezoelectric film, the concentration of A and/or B is changed in the thickness direction of the piezoelectric film and the maximum value of the concentration of A and/or B is shown in a region within 40% from the upper electrode side in the thickness direction of the piezoelectric film.

3. The piezoelectric element according to claim 1, wherein in the piezoelectric film, the concentration of A and/or B is changed in the thickness direction of the piezoelectric film and the minimum value of the concentration of A and/or B is shown in a region within 20% from the lower electrode side in the thickness direction of the piezoelectric film.

4. The piezoelectric element according to claim 1, wherein the film thickness of the piezoelectric film is between 1 and 25 μm.

5. The piezoelectric element according to claim 1, wherein the piezoelectric film is composed of plural layers different in composition.

6. The piezoelectric element according to claim 5, wherein the piezoelectric film is composed of 2 to 10 layers different in composition.

7. The piezoelectric element according to claim 1, wherein A represents an element selected from the group consisting of alkaline earth metals, Mn, Fe, Co, Ni, Cu and Zn, and B represents an element selected from the group consisting of V, Nb and Ta.

8. The piezoelectric element according to claim 7, wherein A represents an element selected from the group consisting of Mg, Ni and Zn, and B represents an element selected from the group consisting of Nb and Ta.

9. The piezoelectric element according to claim 1, wherein the piezoelectric film further contains $(Ba_{1-y} Sr_y)TiO_3$ $(0 \leq y \leq 1)$ as a third component.

10. The piezoelectric element according to claim 1, wherein the film thickness of the piezoelectric film is between 1 and 12 μm.

11. The piezoelectric element according to claim 5, wherein the piezoelectric film is composed of 3 to 8 layers different in composition.

12. The piezoelectric element according to claim 1, wherein the piezoelectric film is formed by a gaseous phase method.

13. The piezoelectric element according to claim 12, wherein the gaseous phase method is a MOCVD (Metal Organic Chemical Vapor Deposition) method.

14. A process for producing the piezoelectric element according to any one of claims 1 to 13, which comprises a step of forming a piezoelectric film on a lower electrode and a step of forming an upper electrode on the piezoelectric film, the step of forming the piezoelectric film being conducted using a composition containing piezoelectric materials capable of forming the two basic components and, as required, the third component and/or precursors thereof.

15. An ink jet recording head having the piezoelectric element according to any one of claims 1 to 13.

* * * * *